United States Patent [19]

Shannon

[11] Patent Number: 4,831,423
[45] Date of Patent: May 16, 1989

[54] SEMICONDUCTOR DEVICES EMPLOYING CONDUCTIVITY MODULATION

[75] Inventor: John M. Shannon, Whyteleafe, England

[73] Assignee: U.S. Philips Corporation, New York, N.Y.

[21] Appl. No.: 119,304

[22] Filed: Nov. 6, 1987

Related U.S. Application Data

[63] Continuation of Ser. No. 839,473, Mar. 14, 1986, abandoned.

[30] Foreign Application Priority Data

Mar. 29, 1985 [GB] United Kingdom ................. 8508203

[51] Int. Cl.⁴ ............................................ H01L 29/78
[52] U.S. Cl. ................... 357/23.4; 357/23.8; 357/52; 357/86
[58] Field of Search ................. 357/23.4, 23.8, 38, 357/86, 52, 37

[56] References Cited

U.S. PATENT DOCUMENTS

| | | | |
|---|---|---|---|
| 3,191,061 | 6/1965 | Weimer | 357/59 E |
| 4,003,072 | 1/1977 | Matsushita et al. | 357/38 |
| 4,199,774 | 4/1980 | Plummer | 357/38 |
| 4,258,377 | 3/1981 | Miyata et al. | 357/86 |
| 4,443,931 | 4/1984 | Baliga et al. | 357/23.4 |
| 4,543,596 | 9/1985 | Strack et al. | 357/23.4 |
| 4,567,502 | 1/1986 | Nakagawa et al. | 357/52 |
| 4,602,266 | 7/1986 | Coe | 357/52 |
| 4,603,084 | 12/1986 | Tihanyi | 357/23.4 |
| 4,639,761 | 1/1987 | Singer et al. | 357/23.4 |

FOREIGN PATENT DOCUMENTS

| | | | |
|---|---|---|---|
| 0115098 | 8/1984 | European Pat. Off. | 357/23.4 |
| 50-46081 | 4/1975 | Japan | 357/23.4 |
| 60-05568 | 1/1985 | Japan | 357/23.4 |

Primary Examiner—Andrew J. James
Assistant Examiner—Sara W. Crane

[57] ABSTRACT

A semiconductor device, e.g. a lateral DMOS transistor or bipolar transistor, has a main current path (20) extending through a high resistivity body portion (1) of one conductivity type. A minority-carrier injector region (6) which may be of the opposite conductivity type is provided in the body portion (1) in the vicinity of the current path (20) and serves with an applied forward-bias to inject minority charge carriers (16) which are characteristic of the opposite conductivity type into the body portion (1) to modulate the conductivity of the current path (20). In accordance with the invention one or more further regions (8) of the opposite conductivity type are located in the part of the body portion (1) in the vicinity of the current path (20) and within a minority-carrier diffusion length of the injector region (6) and/or of each other. These further regions (8) float at a potential dependant on the minority-carrier injection (16) from the injector region (6) and serve to inject minority charge carries (18) into areas of the body portion (1) remote from the injector region (6) so as to modulate the conductivity of these areas of the current path (20). The floating regions (8) may be located within the spread of a depletion layer (30) from a reverse-biased p-n junction (2) to increase the breakdown voltage of the junction (2). The body portion (1) may be, e.g., a MOST drain drift region or a bipolar transistor collector region or a thyristor base region.

7 Claims, 2 Drawing Sheets

SEMICONDUCTOR DEVICES EMPLOYING CONDUCTIVITY MODULATION

This is a continuation of application Ser. No. 839,473 filed Mar. 14, 1986 now abandoned.

This invention relates to semiconductor devices employing conductivity modulation, for example, bipolar transistors and lateral field-effect transistors of the DMOS type, and relates particularly but not exclusively to such devices designed for high voltage operation.

European patent application (EP-A) No. 0 115 098 discloses a semiconductor device comprising a semiconductor body having a body portion of one conductivity type and a current path of the device extending through at least said body portion. A minority-carrier injector region forms a barrier with the body portion in the vicinity of the current path, and there is an electrical connection to the injector region for applying a voltage to the injector region to forward-bias the barrier whereby minority charge carriers which are characteristic of the opposite conductivity type are injected into the body portion of said one conductivity type to modulate the conductivity of said body portion.

The device disclosed in EP-A No. 0 115 098 is an insulated-gate field-effect transistor of the lateral DMOS type. The body portion is a drain drift region of high resistivity formed by an epitaxial layer of one conductivity type on a substrate of the opposite conductivity type. A source region of said one conductivity type is provided in a device region of said opposite conductivity type. This device region provides a transistor channel region below an insulated gate and forms with the body portion a p-n junction which is reverse-biased in operation. The injector region serves to inject minority carriers into the drain drift region when the transistor is in the on state, thus resulting in more carriers characteristic of said one conductivity type being emitted from the source region to maintain charge neutrality in the drain drift region. In this manner, the conductivity of the drain drift region is modulated resulting in a substantial reduction in the on-resistance of the device which would otherwise be high due to the high resistivity of the drain drift region. This reduction in on-resistance is achieved without degrading the breakdown voltage characteristics of the device.

However, because the transistor is of the lateral type, the current path between source and drain regions extends over a significant length in the high resistivity epitaxial layer forming the drain drift region. This geometrical layout of the regions of the device confines the conductivity modulation to an area close to the injector region because injected minority carriers are removed by both the upper major surface of the epitaxial layer and by the underlying substrate. Furthermore to obtain good isolation between the active device area and the substrate the minority-carrier diffusion length in the epitaxial layer needs to be short compared with the thickness of the layer. Therefore the conductivity modulation may be ineffective over part of the current path in the drain drift region. The transistor of EP-A No. 0 115 098 is a four terminal device, as an extra terminal is provided for the electrical connection to the injector region.

According to the present invention there is provided a semiconductor device comprising a semiconductor body having a body portion of one conductivity type, a current path of the device extending through at least said body portion, a minority-carrier injector region forming a barrier with the body portion in the vicinity of the current path, and an electrical connection to the injector region for applying a voltage to the injector region to forward-bias the barrier whereby minority charge carriers which are characteristic of the opposite conductivity type are injected into the body portion of said one conductivity type to modulate the conductivity of the current path, which device is characterised in that at least one further region of said opposite conductivity type is located in a part of the body portion in the vicinity of the current path and is spaced from the injector region by a distance which is at most twice a carrier diffusion length for the minority charge carriers in the body portion of said one conductivity type, which further region floats at a potential dependant on the minority-carrier injection from the injector region and serves to inject minority charge carriers which are characteristic of said opposite conductivity type into an area of the body portion of said one conductivity type remote from the injector region.

By providing in this manner at least one such further region in the vicinity of the current path in a device in accordance with the invention the minority-carrier injection is spread from the vicinity of the injector region into an area of the body portion remote from the injector region, so providing conductivity modulation of the current path in that area. The invention may be used to provide conductivity modulation in areas of the body portion even further remote from the injector region. Thus, said one further region may be one of a plurality of further regions of said opposite conductivity type which are located in a part of the body portion in the vicinity of the current path and which are spaced from each other by at most twice a carrier diffusion length for the minority charge carriers in the body portion of the one conductivity type, which further regions float at potentials dependant on the minority-carrier injection from the injector region and serve to inject minority charge carriers into areas of the body portion of said one conductivity type remote from the injector region. This permits the on-resistance of the device resulting from even a long current path in the body portion to be significantly reduced, even when the body portion has a high resistivity to provide a high breakdown voltage and has a short diffusion length to improve isolation or to increase speed of operation.

The invention can be used to considerable advantage in reducing the on-resistance of a device wherein the body portion is of higher resistivity than a device region of said opposite conductivity type which forms a p-n junction with the body portion of the one conductivity type, wherein the p-n junction is reverse-biased in at least one mode of operation of the device, and wherein said one or more further regions are located within the spread of a depletion layer which extends in the body portion from the p-n junction when reverse-biased in said at least one mode of operation. By locating the one or more further regions in this manner, these further regions can serve not only in injecting minority carriers to reduce the on-resistance but also in controlling the spread of the depletion layer to reduce high electric fields and so to increase the breakdown voltage associated with the reverse-biased p-n junction.

A wide variety of arrangements and geometries can be adopted for the minority-carrier injector region, the one or more further regions and (where applicable) said device region of said opposite conductivity type so that a particular arrangement compatible with the desired geometry and characteristics of a particular semiconductor device can be adopted. Particularly in devices of the lateral type having the current path extending between first and second electrode connections at one major surface of the body, there can be a significant length of the path in the body portion which may have a high resistivity to provide a high breakdown voltage. In this situation it is particularly advantageous to obtain a progressive spatial spread of (either or both) the minority-carrier injection and electrical field. In order to achieve this, at least some of said further regions may be arranged successively in a series extending away from the barrier formed by the injector region and/or from the p-n junction formed by the device region, successive regions of said series being spaced by at most twice said minority-carrier diffusion length from each other.

When a series of such further regions is provided within the spread of a depletion layer from a reverse-biased p-n junction to increase the breakdown voltage, a particularly uniform spread of the depletion layer laterally around the p-n junction can be obtained when, in plan view, said further regions are part of an annular region structure arranged concentrically around said device region forming the p-n junction.

Depending on the particular semiconductor device the injector region may be a metal layer which forms a Schottky barrier with the semiconductor material at the body surface. However, in most devices the minority-carrier injector region may be formed by a region of said opposite conductivity type in the body and forming a p-n junction barrier with the body portion of said one conductivity type. The injector region may be provided in addition to the normal device regions of the device; however in some devices where minority carrier injection into the body portion already occurs from a normal device region (for example a transistor base region operating under saturated current conditions or a thyristor anode region) this device region may be used to provide the injector region. In some cases the minority-carrier injector region may be located beside the current path which is to be conductivity modulated, whereas in other cases this current path may extend through the minority-carrier injector region.

The invention is particularly useful for reducing on-resistance (and obtaining a high breakdown voltage) for lateral DMOS-type transistors. A device in accordance with the invention may comprise an insulated-gate field-effect transistor having a source region of said one conductivity type provided in said junction-forming device region of said opposite conductivity type, the body portion of said one conductivity type forming a drain drift region of the transistor. In order to simplify the electrode arrangement, the electrode connection to the injector region may also be connected to the body portion to form a drain electrode connection of the transistor.

In another form also in accordance with the invention, the semiconductor device comprises a bipolar transistor having an emitter region of said one conductivity type provided in said junction-forming device region of said opposite conductivity type which forms a base region of the bipolar transistor. In this case, the body portion of said one conductivity type may form a collector region of the bipolar transistor, or it may form a base region of said one conductivity type of a thyristor of which the transistor forms a part.

These and other features in accordance with the invention will be illustrated more specifically in embodiments of the invention now to be described, by way of example, with reference to the accompanying diagrammatic drawings, in which.

Figure 1:
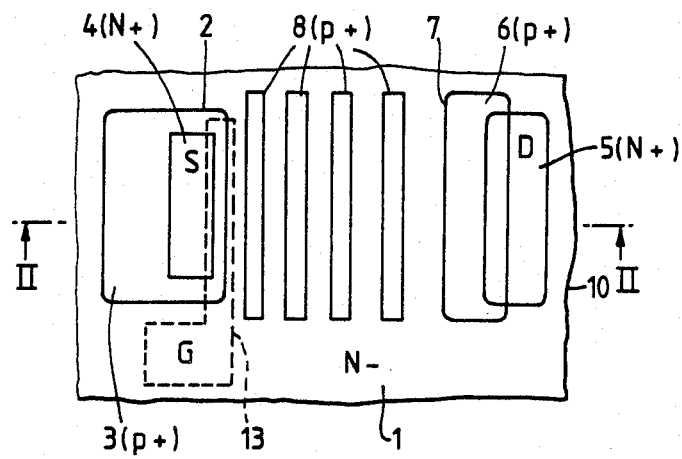
FIG. 1 is a plan view of part of an insulated-gate field-effect transistor in accordance with the invention.

It should be noted that all of the Figures are diagrammatic and not drawn to scale. The relative dimensions and proportions of parts of these Figures (particularly some of the thicknesses) have been shown exaggerated or diminished for the sake of clarity and convenience in the drawings. The same reference signs as used in one embodiment are generally used when referring to corresponding or similar parts in other embodiments.

Figure 2:
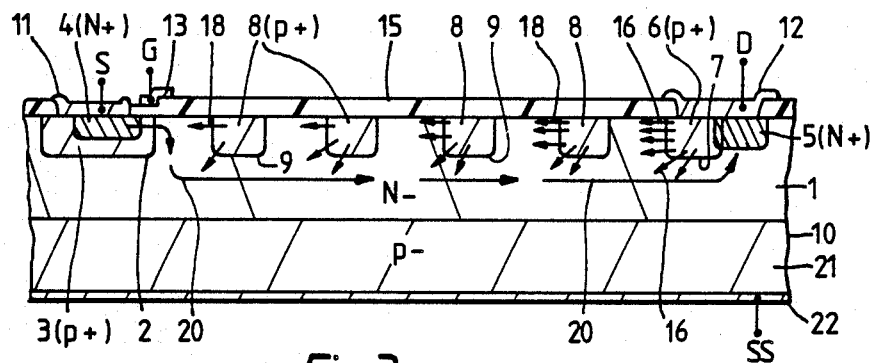
FIG. 2 is a cross-section of the transistor of FIG. 1, taken on the line II—II of FIG. 1 and illustrating minority-carrier injection with the transistor in its on state.
Figure 3:
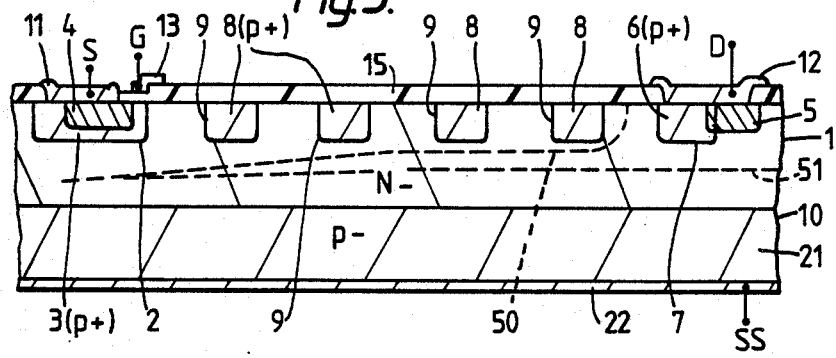
FIG. 3 is the cross-section of FIG. 2 but illustrating the depletion-layer spread with the transistor in its blocking state.

The device of FIGS. 1 to 3 comprises a semiconductor body 10, for example of monocrystalline silicon, having a body portion 1 of one conductivity type (n type, in this example). Only a central area of the body 10 is shown in the Figures. Between first and second electrodes 11 and 12 respectively of the device a current path 20 extends through the body portion 1 (see FIG. 2); in this example the current path 20 also extends through device regions 3, 4 and 5. The device further comprises a minority-carrier injector region 6 forming a barrier 7 with the body portion 1 in the vicinity of the current path 20; in this example the injector region 6 is a semiconductor region of opposite conductivity type (p type) which is located in the body 10 and forms a p-n junction barrier 7. There is an electrical connection to the injector region 6 for applying a voltage to the injector region 6 to forward-bias the barrier 7 whereby minority charge carriers (holes, in this example; i.e. characteristic of the opposite conductivity type which is p type in this example) are injected into the body portion 1 (as denoted by arrows 16) to modulate the conductivity of the current path 20; in this example, the electrode arrangement is simplified by employing the electrode connection 12 of the device region 5 to provide also the connection to the injector region 6.

In accordance with the present invention further regions 8 of said opposite conductivity type (p type, in this example) are located in a part of the body portion 1 in the vicinity of the current path 20 and are spaced from the injector region 6 or from each other by distances which are at most twice a carrier diffusion length (L) for minority charge carriers in the body portion 1. The further regions 8 which form p-n junctions 9 with the body portion 1 have no electrical connections and float at a potential dependant on the minority-carrier injection 16 from the injector region 6. These further regions 8 serve to inject minority carriers (as denoted by arrows 18 in FIG. 2) into areas of the body portion 1 remote from the injector region 6. In this manner, conductivity modulation can occur over the whole length of the current path 20 in the body portion 1, i.e. both in the vicinity of and remote from the injector region 6.

Furthermore, in accordance with the invention, the device region 3 of said opposite conductivity type (p type in this example) forms with the body portion 1 a p-n junction 2 which is reverse-biased in one mode of operation of the device, i.e. a voltage blocking mode illustrated in FIG. 3. In this mode the p-n junction 2 blocks a high voltage applied between the electrodes 11 and 12, the voltage drop being carried largely by the spread of a depletion layer 50 in the body portion 1. The body portion 1 has a significantly higher resistivity than the region 3 so as to carry this voltage drop. The one or more further regions 8 are located within the spread of this depletion layer 50 in the body portion 1 from the p-n junction 2 and so the regions 8 serve to relieve high electric fields in the depletion layer 30 thereby increasing the breakdown voltage of the junction 2.

The device of FIGS. 1 to 3 is an insulated-gate field-effect transistor of the lateral DMOS type. The body portion 1 forms a low-doped drain drift region (denoted N- in FIGS. 1 to 3) which is present as an epitaxial layer on a p type substrate 21. There is an electrode connection 22 to the back of the substrate 21 which may be connected to the same potential as the source electrode 11. The regions 3, 5, 6 and 8 are formed by local doping of the layer 1 in known manner using conductivity type determining impurities. The region 5 is a highly doped drain region of the transistor (denoted N+ in FIGS. 1 to 3). A highly doped n type source region 4 is provided in the p type device region 3. At the surface of the layer 1 there is an insulating and passivating layer 15 having contact windows for the electrodes 11 and 12. A gate electrode 13 is present on a thin part of the insulating layer 15 over the part of the source to drain current path 20 which extends through the region 3. This electrode 13 is shown in broken outline in FIG. 1. In the absence of a signal applied to the gate 13 the transistor will block voltages applied between the source and drain electrodes 11 and 12 as illustrated in FIG. 3. Reference 50 denotes the depletion layer from the reverse-biased p-n junction 2, whereas reference 51 denotes the depletion layer from the reverse-biased junction between the layer 1 and the substrate 21. When a signal above the threshold voltage is applied to the gate 13 the transistor is turned on and majority carriers (electrons) flow out of the source region 4 into the body portion 1. This is accompanied by minority carrier injection 16 and 18 which reduces the on-resistance of the device by reducing the resistivity along the length of the path 20 in the layer portion 1. The electrical connections to the electrodes 11, 12, 13 and 22 are designated as S, D, G and SS in FIGS. 2 and 3.

Four floating regions 8 are illustrated by way of example in FIGS. 1 to 3. These four regions 8 are arranged successively in a series extending in one direction away from the barrier 7 formed by the minority-carrier injector region 6 and in the opposite direction away from the p-n junction 2 formed by the device region 3, see FIG. 1. Successive regions 8 of this series are spaced from each other by at most 2.L (twice a minority-carrier diffusion length L in the layer portion 1). With the simple one-sided transistor geometry illustrated in FIG. 1 the floating regions 8 may simply be straight parallel stripes as illustrated in the plan view of FIG. 1. In a specific example of the transistor of FIGS. 1 to 3, the n type layer portion may have a resistivity of 40 ohm.cm. and a minority-carrier diffusion length of 10$\mu$m (micrometres) which may be obtained by, for example, proton bombardment. The regions 3, 6 and 8 may be 10$\mu$m deep. To improve the device isolation the epitaxial layer 1 may be several diffusion lengths thick, for example 50 $\mu$m thick. The device region 3 may be 90 $\mu$m long by 60 $\mu$m wide, each of the floating regions 8 may be 100 $\mu$m long by 15 microns wide, the injector region 6 may be 100 $\mu$m long by 25 $\mu$m wide and the regions 8 may be spaced from each other and from the regions 3 and 6 by areas of the n type layer portion 1 each of which is 15 $\mu$m wide, i.e. 1½ times the diffusion length L. The insulating and passivating layer 15 outside the area below the gate 13 may comprise, for example oxygen-doped semi-insulating polycrystalline silicon over silicon dioxide.

It will be evident that other dimensions may be adopted and many modifications are possible. Thus, for example, the efficiency of the minority carrier injection 18 can be increased by reducing the spacing of the regions 8 and 6, for example to a carrier diffusion length L or less, and the spacing may vary for the different regions 8 in the different areas to control the injection 18 in these areas according to an optimum pattern along the current path 20. However, the spacing should not be too large (i.e. not greater than 2.L) or the efficiency of minority-carrier collection and reinjection by the regions 8 will be so poor as to have a negligible conductivity modulation effect in that area.

The minority-carrier injector region 6 may be broken up into more than one region 6 all of which may still be contacted by the electrode 12. Furthermore, instead of each successive floating region 8 in the series being a single continuous stripe, each stripe may be broken up in its direction of length so as to form a two-dimensional array of floating regions 8 between the device region 3 and injector region 6 or regions 6. A larger or smaller number of floating regions 8 may be provided in the series, or in some devices it may be sufficient to provide merely one floating region 8 of appropriate shape.

Figure 4:
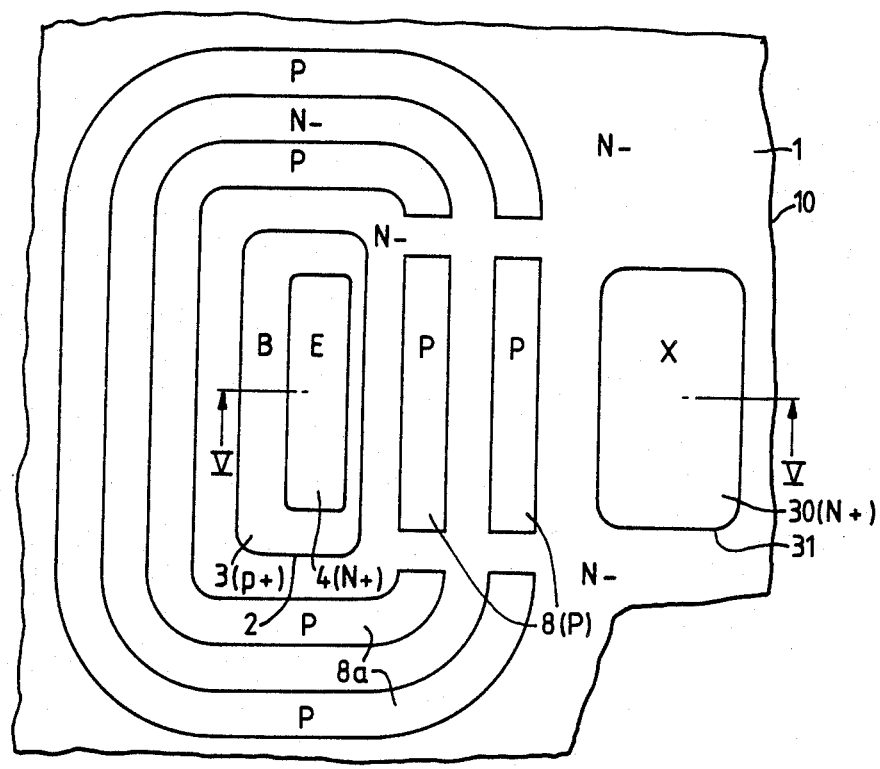
FIG. 4 is a plan view of part of a device comprising a bipolar transistor in accordance with the invention.

FIG. 4 illustrates another possibility in which the floating regions 8 in the series are part of an annular structure 8, 8a arranged concentrically around the device region 3. In this example there are two rings shown each of which is broken up in its direction of length so that the part 8 of each ring between the device region 3 and the injector region 6 is discontinuous with the remainder 8a of the ring. This discontinuity ensures that most of the minority-carrier injection 18 and resulting conductivity modulation occurs in the active device area between the regions 3 and 6, whereas the annular region structure 8 and 8a enhances the breakdown voltage of the p-n junction 2 by encouraging a uniform spread of the depletion layer 50 laterally around the junction 2 in the voltage blocking condition. The blocking characteristics of reverse-biased p-n junction 2 can also be enhanced by reducing the net doping concentration of the floating regions 8 (and 8a, if present) to such a level that they become significantly depleted by the depletion layer 50. Thus, a major part of each region 8 may be depleted in this manner. Furthermore, instead of a monocrystalline epitaxial layer 1 on a monocrystalline semiconductor substrate 21, the semiconductor body portion 1 of a device in accordance with the invention may be formed more cheaply as a semiconductor layer (for example of polycrystalline or amorphous semiconductor material) on a substrate 21 which is of electrically insulating material at least adjacent the semiconductor layer 1. Although such a layer 1 may have a low minority-carrier diffusion length, the use of the present invention still permits conductivity modulation to be achieved along the whole current path 20.

Any of these modifications may be employed with a lateral field-effect transistor, for example with the lateral DMOS transistor of FIGS. 1 and 2.

Figure 5:
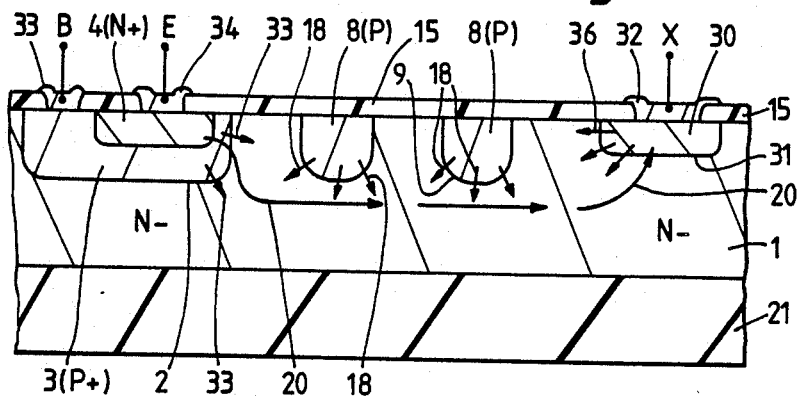
FIG. 5 is a cross-section of the device of FIG. 4, taken on the line V—V of FIG. 4.

As illustrated in FIGS. 4 and 5 the invention may be incorporated in other types of semiconductor device, besides lateral field-effect transistors. Thus, FIGS. 4 and 5 illustrate a bipolar transistor made in a semiconductor layer 1 on an insulating substrate 21. The transistor has an n type emitter region in a p type base region 3. The base and emitter regions 3 and 4 have separate connections B and E to individual base and emitter electrodes 33 and 34 at separate contact windows in the insulating and passivating layer 15 at the layer surface. The current path 20 extends between the emitter electrode 34 and an electrode 32 which contacts a region 30 in the layer 1 and which has a connection denoted as X in FIG. 5. The nature of the region 30 depends on the type of device formed by this bipolar transistor.

In one form, the n type layer portion 1 of FIGS. 4 and 5 is a low-doped part of a collector region of the transistor. In this case, the region 30 may be a highly doped n type collector contact region so that the electrode 32 and connection X form the collector electrode connection of the transistor. When this transistor is turned on by a signal at the base electrode 33 and is operated with current saturation between the emitter and collector electrode connections, the base-collector junction 2 becomes forward-biased in known manner so that the base region 3 begins to inject minority carriers (holes) into the current path in the n type layer portion 1 as denoted by arrows 35 in FIG. 5. Since the nearest floating region 8 is within twice a minority-carrier diffusion length of the junction 2 it collects some of these injected carriers and then itself injects holes into the areas remote from the junction 2, as denoted by arrows 18 in FIG. 5. These injected holes are similarly collected and injected by the second floating region 8. In this manner the on-resistance along the length of the current path 20 in the layer portion 1 is reduced by conductivity modulation. Thus in this case the base region 3 (having its electrode connection 33 and B) also serves as the minority-carrier injector region corresponding to region 6 of FIG. 1, and the base-collector junction 2 serves as the injecting barrier corresponding to barrier 7 of FIG. 1.

In another form of the device in FIGS. 4 and 5, the n type layer portion 1 forms a low-doped n type base region of a thyristor of which the bipolar transistor forms a part. In this case, the region 30 may be a highly doped p type anode region of the thyristor which forms a p-n junction 31 with the layer portion 1. The electrode 32 and connection X then form the anode electrode connection of the thyristor. When this thyristor is turned on by a signal at the base electrode 33 and is operated with current saturation between the cathode and anode regions 4 and 30, both the p-n junctions 2 and 31 become forward biased in known manner. Thus, in this case, both the p type regions 3 and 30 serve as the minority-carrier injector region (6), and the p-n junctions 2 and 31 serve as the minority-carrier injecting barriers (7). The floating regions 8 are within twice a minority-carrier diffusion length of the regions 3 and 30 and so function in a similar manner in distributing the minority-carrier injection along the current path 20 in the layer portion 1.

When the transistor or thyristor of FIGS. 4 and 5 is in its blocking state, a depletion layer spreads from the junction 2 which is reverse-biased by the emitter-collector or cathode-anode voltage. In a similar manner to that illustrated in FIG. 3, the floating regions 8 located within the spread of this depletion layer enhance the blocking characteristics of the junction 2. Preferably the floating regions 8 have a low doping concentration so as to be substantially depleted in this condition. In the case of a thyristor the floating regions 8 may similarly enhance the blocking characteristics of the junction 31 when a cathode-anode voltage of opposite polarity is applied.

Another type of device in which the invention may be similarly incorporated is a PIN diode. This diode may have a structure similar to that of FIGS. 4 and 5, for example, but omitting the n type region 4, electrode 34 and connection E. In this diode the current path 20 would extend from p type anode region 30 through the very lightly doped or near intrinsic body portion 1 to n type cathode region 3, and the diode would have an anode electrode connection 32 and X and a cathode electrode connection 33 and B. The floating regions 8 in this PIN diode would function in a similar manner in distributing the minority-carrier injection along the current path 20 in the body portion 1.

I claim:

1. An insulated gate field effect transistor comprising a semiconductor body having a body portion of one conductivity type forming a drain drift region of said transistor, a current path of the device extending through at least said drain drift region, a region of a conductivity type opposite that of said one type providing a channel region of said transistor and comprising a P-N junction within said drain drift region, a drain region in said drain drift region, said drain region being on only one side of said channel region, a minority carrier injector region forming a barrier with said drain drift region in the vicinity of the current path, and an electrical connection to the injector region for applying a voltage to the injector region to forward-bias the barrier whereby minority charge carriers which are characteristic of the opposite conductivity type are injected into said drain drift region to modulate the conductivity of the current path, wherein at least one further region of said opposite conductivity type is present in a part of said drain drift region which is in the vicinity of the current path and between the channel region and the drain region, said further region being located substantially wholly on said one side of said channel region and being spaced from the injector region by a distance which is at most twice a carrier diffusion length for the minority charge carriers in said drain drift region, which further region floats at a potential dependent on the minority-carrier injection from the injector region and serves to inject minority charge carriers which are characteristic of said opposite conductivity type into an area of said drain drift region remote from the injector region.

2. An insulated gate field effect transistor as in claim 1 including a source region of said one conductivity type in said channel region and wherein an insulation layer is on top of said channel region and a gate electrode is on said insulation layer between said source and drain regions.

3. An insulated gate field effect transistor as claimed in claim 1 wherein said one further region is one of a plurality of further regions of said opposite conductivity type which are located in a part of the drain drift region in the vicinity of said current path and which are spaced from each other by at most twice a carrier diffusion length for the minority charge carriers in the drain drift region, which plurality of further regions float at a potential dependent on the minority carrier injection from the injector region and serve to inject minority charge carriers into areas of the drain drift region remote from the injector region.

4. An insulated gate field effect transistor as claimed in claim 3 wherein at least some of said further regions are arranged successively in a series extending away from the barrier formed by the injector region, successive regions of said series being spaced by at most twice said minority-carrier diffusion length from each other.

5. An insulated gate field effect transistor as in claim 4 wherein the electrical connection to the injector region is also connected to the drain region of the transistor.

6. An insulated gate field effect transistor as in claim 4 wherein said further regions form parts of substantially annular structures arranged concentrically around the channel region, discontinuities being present in the substantially annular structures on said one side of said channel region so as to separate said further regions from the remaining parts of the substantially annular structures.

7. An insulated gate field effect transistor as in claim 4 wherein the drain drift region is of higher resistivity than the gate region.

* * * * *